(12) United States Patent
Ikeuchi

(10) Patent No.: US 10,778,225 B2
(45) Date of Patent: Sep. 15, 2020

(54) INTEGRATED CIRCUIT SYSTEM, STARTUP CONTROL METHOD FOR INTEGRATED CIRCUIT SYSTEM, AND STARTUP CONTROL PROGRAM

(71) Applicant: NEC Corporation, Minato-ku, Tokyo (JP)

(72) Inventor: Katsuhisa Ikeuchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/495,432

(22) PCT Filed: Nov. 10, 2017

(86) PCT No.: PCT/JP2017/040539
§ 371 (c)(1),
(2) Date: Sep. 19, 2019

(87) PCT Pub. No.: WO2018/173357
PCT Pub. Date: Sep. 27, 2018

(65) Prior Publication Data
US 2020/0067508 A1  Feb. 27, 2020

(30) Foreign Application Priority Data

Mar. 21, 2017  (JP) ................... 2017-055025

(51) Int. Cl.
*H03K 19/003* (2006.01)
*H03K 19/1776* (2020.01)
*H03K 19/00* (2006.01)

(52) U.S. Cl.
CPC ..... *H03K 19/0033* (2013.01); *H03K 19/0008* (2013.01); *H03K 19/1776* (2013.01)

(58) Field of Classification Search
CPC .......... H03K 19/0033; H03K 19/0008; H03K 19/1776
See application file for complete search history.

(56) References Cited

U.S. PATENT DOCUMENTS 6,839,873 B1 * 1/2005 Moore ............ G01R 31/31701
326/38
2007/0075736 A1 * 4/2007 Goodnow ............ H03K 19/177
326/41

(Continued)

FOREIGN PATENT DOCUMENTS

JP  2005-191872 A  7/2005
JP  2008/052389 A  3/2008

(Continued)

OTHER PUBLICATIONS

English Translation of JP 2012-118904 A, Sato Shoichi, Jun. 21, 2012, pp. 1-12 (Year: 2012).*

(Continued)

*Primary Examiner* — Daniel D Chang

(57) ABSTRACT

An integrated circuit system includes: a storage element which stores in advance a plurality of pieces of circuit information and startup control circuit information used to configure a startup control logic circuit for selecting circuit information that has not failed in configuring a logic circuit; and an integrated circuit which, at the time of startup or when configuration of the logic circuit based on any of the plurality of pieces of circuit information has failed, configures the startup control logic circuit by reading the startup control circuit information from the storage element, causes the configured startup control logic circuit to select the circuit information that has not failed in configuring the logic circuit, reads the circuit information selected by the startup control logic circuit from the storage element, and configures the logic circuit according to the circuit information.

4 Claims, 12 Drawing Sheets

(56) References Cited

U.S. PATENT DOCUMENTS

2015/0171869 A1 6/2015 Takehara
2016/0139811 A1 5/2016 Ikeuchi

FOREIGN PATENT DOCUMENTS

| JP | 2009-182438 A | 8/2009 |
| JP | 2012-118904 A | 6/2012 |
| JP | 2015-119359 A | 6/2015 |
| JP | 6032360 B2 | 11/2016 |

OTHER PUBLICATIONS

English Translation of JP 2005-191872 A, Katsumata Michiyuki, Jul. 14, 2005, pp. 1-11 (Year: 2005).*
International Search Report for PCT Application No. PCT/JP2017/040539, dated Feb. 6, 2018.
Extended European Search Report for EP Application No. EP17901905.4 dated Mar. 23, 2020.

* cited by examiner

FIG. 9

| PATTERN | FIRST STATUS REGISTER | STARTUP IMAGE INFORMATION | STARTUP HISTORY INFORMATION | PROCESSING | CONFIGURATION SEQUENCE |
|---|---|---|---|---|---|
| 1 | NORMAL | 0x0 | 0x0 | CONFIGURE DATA A | NORMAL TYPE |
| 2 | NORMAL | 0x1 | 0x0 | CONFIGURE DATA B | NORMAL TYPE |
| 3 | NORMAL | 0x0 | 0x1 | CONFIGURE DATA A | NORMAL TYPE |
| 4 | NORMAL | 0x1 | 0x1 | CONFIGURE DATA B | NORMAL TYPE |
| 5 | ERROR | 0x0 | 0x0 | CONFIGURE DATA B | PSEUDO-NORMAL TYPE |
| 6 | ERROR | 0x1 | 0x0 | HARDWARE FAILURE (PROCESSING TERMINATED) | ABNORMAL TYPE |
| 7 | ERROR | 0x0 | 0x1 | HARDWARE FAILURE (PROCESSING TERMINATED) | ABNORMAL TYPE |
| 8 | ERROR | 0x1 | 0x1 | CONFIGURE DATA A | PSEUDO-NORMAL TYPE |

INTEGRATED CIRCUIT SYSTEM, STARTUP CONTROL METHOD FOR INTEGRATED CIRCUIT SYSTEM, AND STARTUP CONTROL PROGRAM

This application is a National Stage Entry of PCT/JP2017/040539 filed on Nov. 10, 2017, which claims priority from Japanese Patent Application 2017-055025 filed on Mar. 21, 2017, the contents of all of which are incorporated herein by reference, in their entirety.

TECHNICAL FIELD

The present invention relates to an integrated circuit system, a startup control method for an integrated circuit system, and a startup control program.

BACKGROUND ART

With the increase in capacity of programmable devices such as FPGAs (Field Programmable Gate Array), the data size of configuration data is also increasing. Therefore, recently, it has become impossible to ignore the bit error rate of configuration data, which is bit stream data. Further, while the refinement of device processes has progressed to afford benefits in terms of power consumption, performance, cost, and the like, they are more susceptible to soft errors due to cosmic rays.

As a result, a phenomenon occurs in which the programmable device does not start normally even without a hardware fault. Consequently, every time the phenomenon occurs, a hardware repair must be performed, and an increase in the number of extra man-hours and costs is incurred. Furthermore, the programmable device becomes stuck if it does not start normally. This causes the system to go down, and causes inconvenience to the operating user. Therefore, a solution to these problems is also desired from a fail-safe perspective.

In volatile programmable devices such as FPGAs, techniques have been proposed that focus on the issue of rewriting circuit information (for example, see Patent Document 1 and Patent Document 2). In particular, the technique described in Patent Document 1 attempts to solve the above problems. In the technique described in Patent Document 1, when performing processing that reads circuit information into a FPGA and configures a logic circuit (hereinafter, also referred to as configuration processing), a redundant function is provided that prevents the FPGA from becoming stuck even if the configuration processing fails due to various factors.

The technique described in Patent Document 1, for example, is a configuration including a FPGA as shown in FIG. 10, and is a system that performs processing as shown in FIG. 11 and FIG. 12. In FIG. 10, the interface 201 is a config I/F. The interface 202 is an original I/F. Furthermore, reference symbol 203 denotes a signal line. In this system, when the FPGA 102 determines that a soft error has occurred in the circuit information read from the flash memory 100 via the PLD 101 (FIG. 11: step S3, True), the PLD 101 is notified of a configuration NG (FIG. 11: step S7). Causes of the soft error may, as described above, include abnormalities such as inversion of a bit in a bit stream (binary information consisting of 0s and 1s) included in the circuit information, and abnormalities caused by the effects of cosmic rays.

When the PLD 101 receives the notification of the configuration NG from the FPGA 102 (FIG. 12: step S22, True), it refers to the startup image information of the flash memory 100, and reads from the flash memory 100 other circuit information indicated by the inverted value of the value of the startup image information (FIG. 12: step S23). The PLD 101 transmits the read other circuit information to the FPGA 102 (FIG. 12: step S25). As a result, for example, in the case where two pieces of circuit information, circuit information A and circuit information B, exist as circuit information, and the configuration processing with circuit information A fails, it becomes possible for the configuration processing to be performed with circuit information B. If configuration processing with circuit information A fails but succeeds with circuit information B, a soft error is detected. On the other hand, when the configuration processing fails with both circuit information A and circuit information B, a hardware failure is detected.

CITATION LIST

Patent Documents

[Patent Document 1]
Japanese Patent (Granted) Publication No. 6,032,360
[Patent Document 2]
Japanese Unexamined Patent Application, First Publication No. 2009-182438

SUMMARY OF INVENTION

Problem to be Solved by the Invention

In the technique described in Patent Document 1, the PLD 101 determines information that indicates whether the FPGA 102 performed configuration processing with circuit information A or circuit information B, and information that indicates whether the FPGA 102 succeeded or failed to perform the configuration processing. Consequently, the technique described in Patent Document 1 takes a configuration in which, in order to perform the configuration processing of the FPGA 102, a separate control device is required in the form of the PLD 101.

However, the need for such a separate control device results in component costs of the control device being incurred in an actual device development. Consequently, there is a problem that the device cost rate becomes worse.

Furthermore, it is necessary to secure a mounting area for the control device on the mounting substrate. Consequently, additional work such as examining the arrangement of the control device is created during substrate design. Moreover, there is a problem that size reduction is inhibited.

The present invention provides an integrated circuit system, a startup control method of an integrated circuit system, and a startup control program that solve the above problems.

Means for Solving the Problem

In order to solve the problems described above, an aspect of the present invention is an integrated circuit system including: a storage element which stores in advance a plurality of pieces of circuit information and startup control circuit information used to configure a startup control logic circuit for selecting circuit information that has not failed in configuring a logic circuit; and an integrated circuit which, at the time of startup or when configuration of the logic circuit based on any of the plurality of pieces of circuit information has failed, configures the startup control logic circuit by reading the startup control circuit information from the storage element, causes the configured startup control logic circuit to select the circuit information that has not failed in configuring the logic circuit, reads the circuit information selected by the startup control logic circuit from the storage element, and configures the logic circuit according to the circuit information.

Furthermore, an aspect of the present invention is a startup control method of an integrated circuit system provided with a storage element which stores a plurality of pieces of circuit information, and an integrated circuit which reads the circuit information from the storage element and configures a logic circuit according to the circuit information. The method includes: storing, in the storage element, startup control circuit information used to configure a startup control logic circuit for selecting the circuit information that has not failed in configuring the logic circuit; configuring, at the time of startup or when configuration of the logic circuit based on any of the plurality of pieces of circuit information has failed, the startup control logic circuit with respect to the integrated circuit based on the startup control circuit information in the storage element; causing the configured startup control logic circuit to select the circuit information that has not failed in configuring the logic circuit; and configuring the logic circuit with respect to the integrated circuit based on the circuit information selected by the startup control logic circuit.

Furthermore, an aspect of the present invention is a startup control program that serves as startup control circuit information that causes an integrated circuit, which is connected to a storage element that stores a plurality of pieces of circuit information and configures a logic circuit according to the circuit information, to execute the steps of: configuring, at the time of startup or when configuration of a logic circuit based on any of the plurality of pieces of circuit information has failed, a startup control logic circuit to cause the startup control logic circuit to select the circuit information that has not failed in configuring the logic circuit; reading the circuit information selected by the startup control logic circuit from the storage element; and configuring the logic circuit based on the circuit information.

Effects of the Invention

According to the present invention, when startup fails in a programmable integrated circuit, it becomes possible for startup to be performed using other circuit information that has not failed, and without using another control device.

BRIEF DESCRIPTION OF THE DRAWINGS

FIG. 9 is a diagram showing activation patterns of first configuration data and second configuration data in the same embodiment.

EMBODIMENTS FOR CARRYING OUT THE INVENTION

Figure 1:
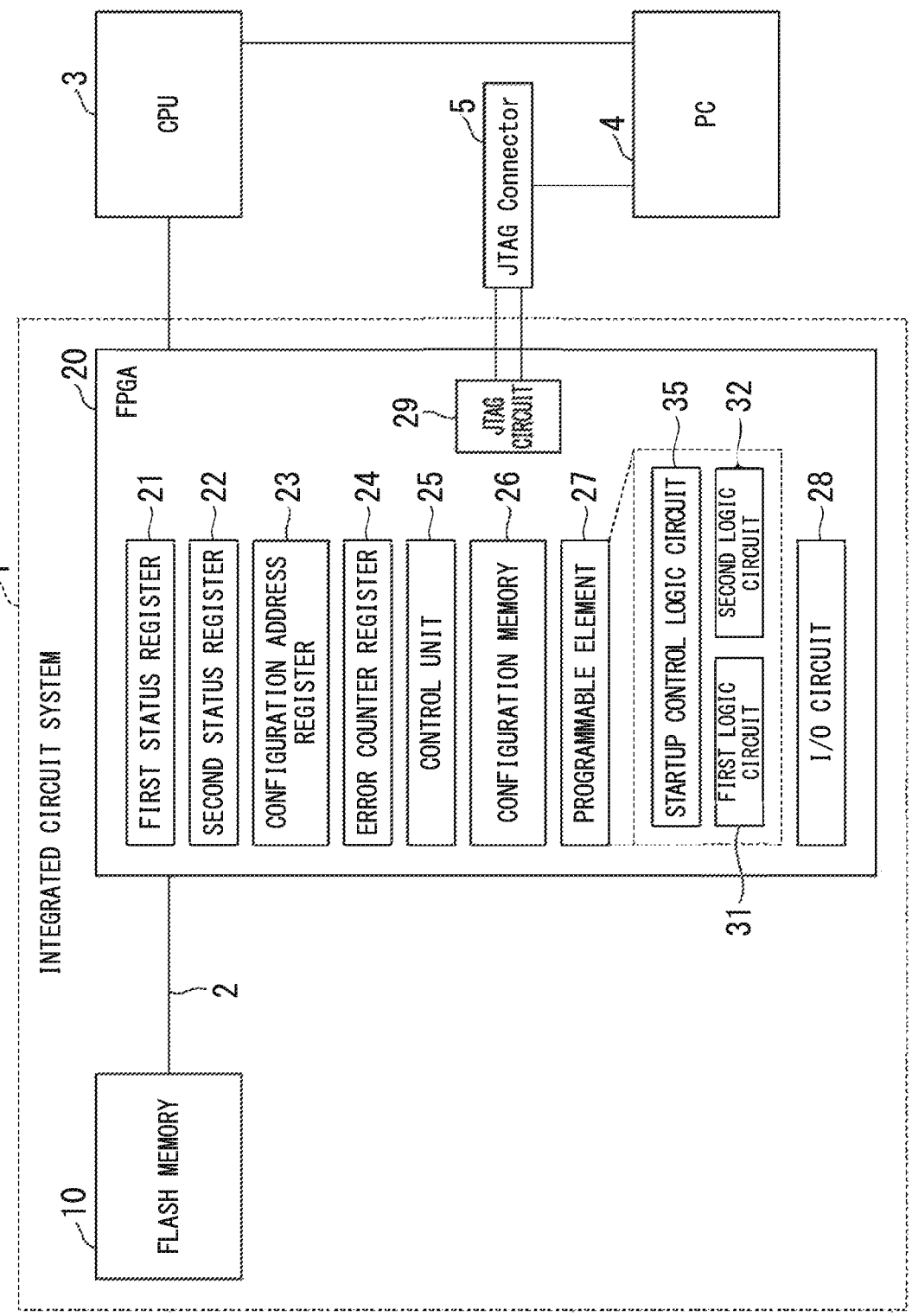
FIG. 1 is a block diagram showing a connection relationship between an integrated circuit system 1 according to an exemplary embodiment and devices connected to the integrated circuit system 1.

Hereunder, an exemplary embodiment of the present invention will be described with reference to the drawings. FIG. 1 is a block diagram showing a configuration of an integrated circuit system 1 according to an embodiment, a CPU (Central Processing Unit) 3 and a JTAG (Joint Test Action Group) connector 5 that connect to the integrated circuit system 1, and a PC (Personal Computer) 4 that connects to the CPU 3 and the JTAG connector 5. The integrated circuit system 1 includes a flash memory 10 and a FPGA 20.

The flash memory 10 is connected to the FPGA 20 through a connection line 2. As the connection line 2, for example, a generic serial interface specification such as QSPI (Quad Serial Peripheral Interface) that connects between the FPGA 20 and the flash memory 10 is applied.

Figure 2:
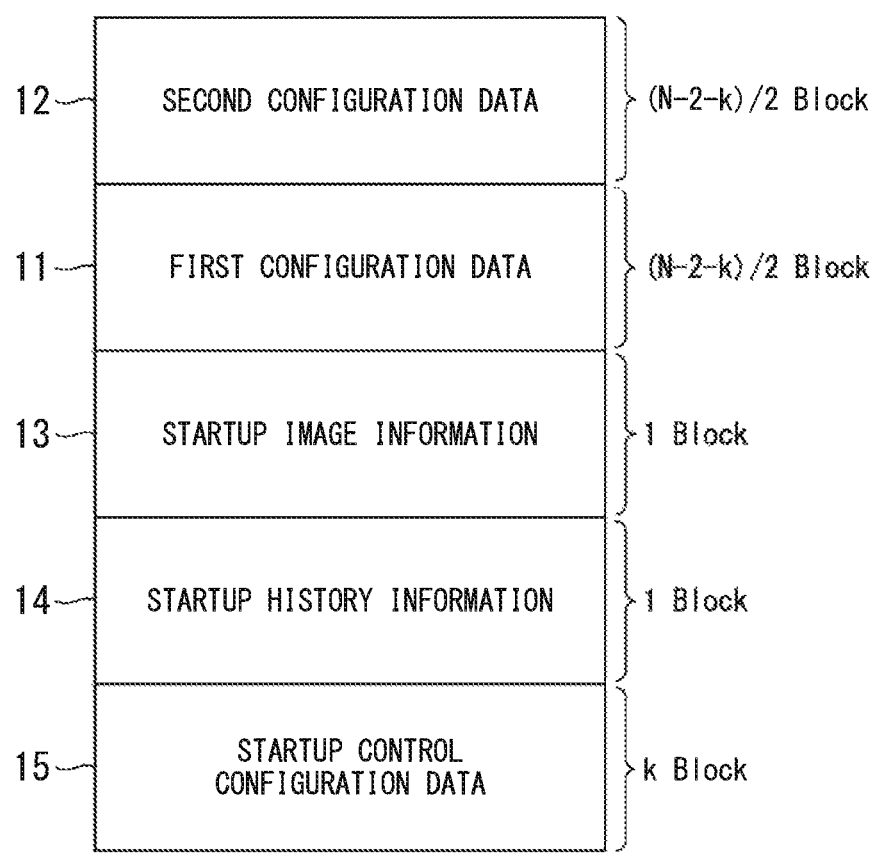
FIG. 2 is a diagram showing a data arrangement example in a flash memory according to the same embodiment.

The flash memory 10 is a non-volatile semiconductor memory that can erase and write data, and is capable of maintaining stored information even when power is not supplied. FIG. 2 is a diagram showing a data arrangement in a flash memory. Data is arranged in the flash memory 10 as shown in FIG. 2. The flash memory 10 stores second configuration data 12, first configuration data 11, startup image information 13, startup history information 14, and startup control configuration data 15.

The first configuration data 11, the second configuration data 12, and the startup control configuration data 15 are circuit information that configures a logic circuit by being read by the FPGA 20 and being activated through configuration processing. For example, the first configuration data 11 and the second configuration data 12 are circuit information that configure the logic circuit that the user of the FPGA 20 actually wants to operate according to a certain application. The startup control configuration data 15 is circuit information that configures a startup control logic circuit.

The startup image information 13 is information indicating whether to activate the first configuration data 11 or the second configuration data 12. The CPU 3 writes the information to the startup image information 13 of the flash memory 10. The FPGA 20 writes, to the startup history information 14, information that indicates the circuit information on which the FPGA 20 performed configuration processing immediately before. That is to say, information indicating the circuit information of either the first configuration data 11 or the second configuration data 12 is written to the startup history information 14. In terms of the size of each data area 11 to 15 of the flash memory 10, when the flash memory 10 has N blocks, the startup image information 13 and the startup history information 14 are respectively one block. Furthermore, the startup control configuration data 15 is k blocks, and the first configuration data 11 and the second configuration data 12 are respectively (N−2−k)/2 blocks.

Returning to FIG. 1, the CPU 3 is implemented with a software control unit that switches the circuit information to be read by the FPGA 20 when the logic circuit of the FPGA 20 is updated according to a version upgrade and the like. In response to instruction signals received from the PC 4, the CPU 3 writes information that indicates the circuit information to be activated to the startup image information 13 of the flash memory 10 through the connection line 2 via the FPGA 20. As a result, the circuit information is switched.

The JTAG connector 5 is connected to a JTAG circuit 29 of the FPGA 20, and performs testing and debugging and the like of the FPGA 20 in response to instruction signals from the PC 4. The PC 4 is connected to the CPU 3 and the JTAG connector 5, and outputs instruction signals to the CPU 3 and the JTAG connector 5 in response to user operations.

The FPGA 20 is a programmable integrated circuit that, by reading circuit information, configures the logic circuit according to the read circuit information. The FPGA 20 includes a first status register 21, a second status register 22, a configuration address register 23, an error counter register 24, a control unit 25, a configuration memory 26, a programmable element 27, an I/O circuit 28, and a JTAG circuit 29. In the FPGA 20, if the configuration processing is successful, the control unit 25 writes the value "0x0" indicating "NORMAL" to the first status register 21. On the other hand, if the configuration processing fails, the control unit 25 writes the value "0x1" indicating "ERROR" to the first status register 21. Furthermore, when cleared by the control unit 25, the value "0x0" indicating "NORMAL" is written to the first status register 21.

The second status register 22 is asserted by the startup control logic circuit 35 when the startup control logic circuit 35 starts processing a FPGA reconfiguration instruction with respect to itself. The startup control logic circuit 35 is configured by activating the startup control configuration data 15 in the FPGA 20. Assert means, for example, to write a value of "0x1".

The start address at which circuit information is stored in the flash memory 10 is written to the configuration address register 23 by the control unit 25 or the startup control logic circuit 35. The configuration processing of the FPGA 20 is started by reading circuit information from the address value of the flash memory 10 stored in the configuration address register 23. The control unit 25 writes the number of times the configuration processing of the startup control configuration data 15 fails, to the error counter register 24.

The control unit 25 initializes the registers described above included in the FPGA 20, that is to say, the first status register 21, the second status register 22, the configuration address register 23, and the error counter register 24, upon startup of the FPGA 20. Furthermore, the control unit 25 writes and reads information and values with respect to the registers. Moreover, the control unit 25 reads information and values stored in the registers, and performs determination processing based on the read information and values. In addition, the control unit 25 reads circuit information from the flash memory 10 using the address value stored in the configuration address register 23 as a start address. Then, the control unit 25 writes the read circuit information to the configuration memory 26. Furthermore, the control unit 25 starts configuration processing with respect to the circuit information written to the configuration memory 26. The control unit 25 is, for example, a logic circuit configured in advance as hardware that performs these processes in the FPGA 20.

The control unit 25 writes circuit information read from the flash memory 10 by the control unit 25 to the configuration memory 26. The programmable element 27 is an element serving as a logic circuit according to the circuit information stored in the configuration memory 26. For example, the programmable element 27 becomes a first logic circuit 31 in a case where the first configuration data 11 is stored, and becomes a second logic circuit 32 in a case where the second configuration data 12 is stored. Furthermore, the programmable element 27 becomes a startup control logic circuit 35 in a case where the startup control configuration data 15 is stored.

The I/O circuit 28 transmits and receives signals to and from an external circuit connected to the FPGA 20. The JTAG circuit 29 is connected to the JTAG connector 5. When the JTAG circuit 29 receives an instruction signal from the PC 4 through the JTAG connector 5, it performs testing and debugging of the FPGA 20, such as testing of the logic circuit configured with respect to the programmable element 27 according to the circuit information.

Figure 3:
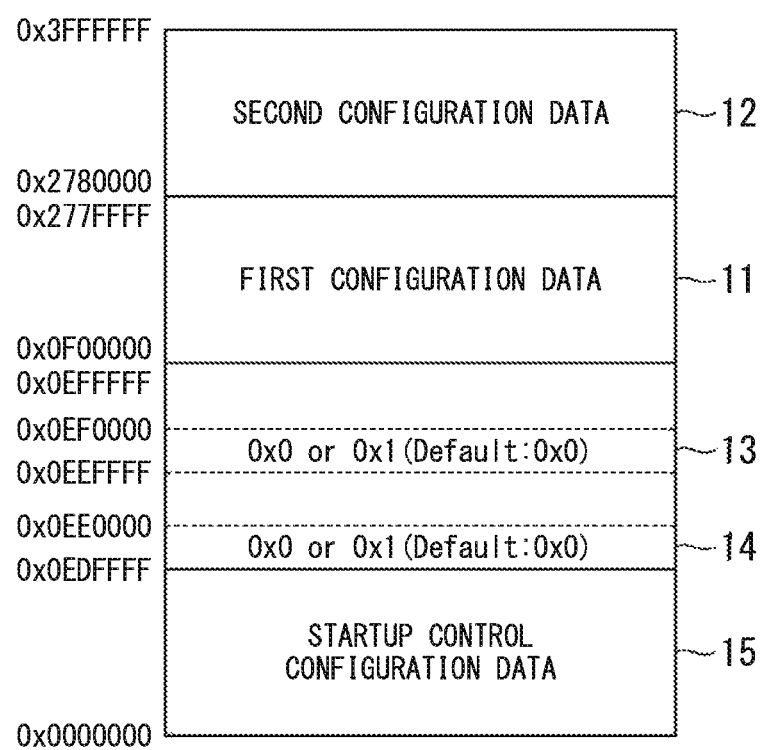
FIG. 3 is a diagram showing a data arrangement example when the flash memory according to the same embodiment is a 512 Mbit flash memory.

FIG. 3 is a diagram showing a data arrangement example when the flash memory 10, for example, is a 512 Mbit flash memory. The startup control configuration data 15 is written to an area having the address values "0x0000000 to 0x0EDFFFF". The startup history information 14 is written to the area having the address value "0x0EE0000". For example, when configuration processing is performed with the first configuration data 11, the value "0x0" is written as the startup history information 14. On the other hand, if the configuration processing is performed with the second configuration data 12, the value "0x1" is written as the startup history information 14.

The startup image information 13 is written to the area having the address value "0x0EF0000". For example, when the first configuration data 11 is specified, the value "0x0" is written as the startup image information 13. On the other hand, when the second configuration data 12 is specified, the value "0x1" is written as the startup image information 13. The first configuration data 11 is written to the area having the address values "0x0F00000 to 0x277FFFF". The second configuration data 12 is written to the area having the address values "0x2780000 to 0x3FFFFFF". For example, when the first configuration data 11 is activated by the FPGA 20, the start address value "0x0F00000" is written to the configuration address register 23. When the configuration address register 23 is cleared, the value "0x0000000" is stored. Consequently, upon startup of the FPGA 20 in a state where the configuration address register 23 has been cleared, the startup control configuration data 15 is selected.

(Configuration Processing)

Figure 4:
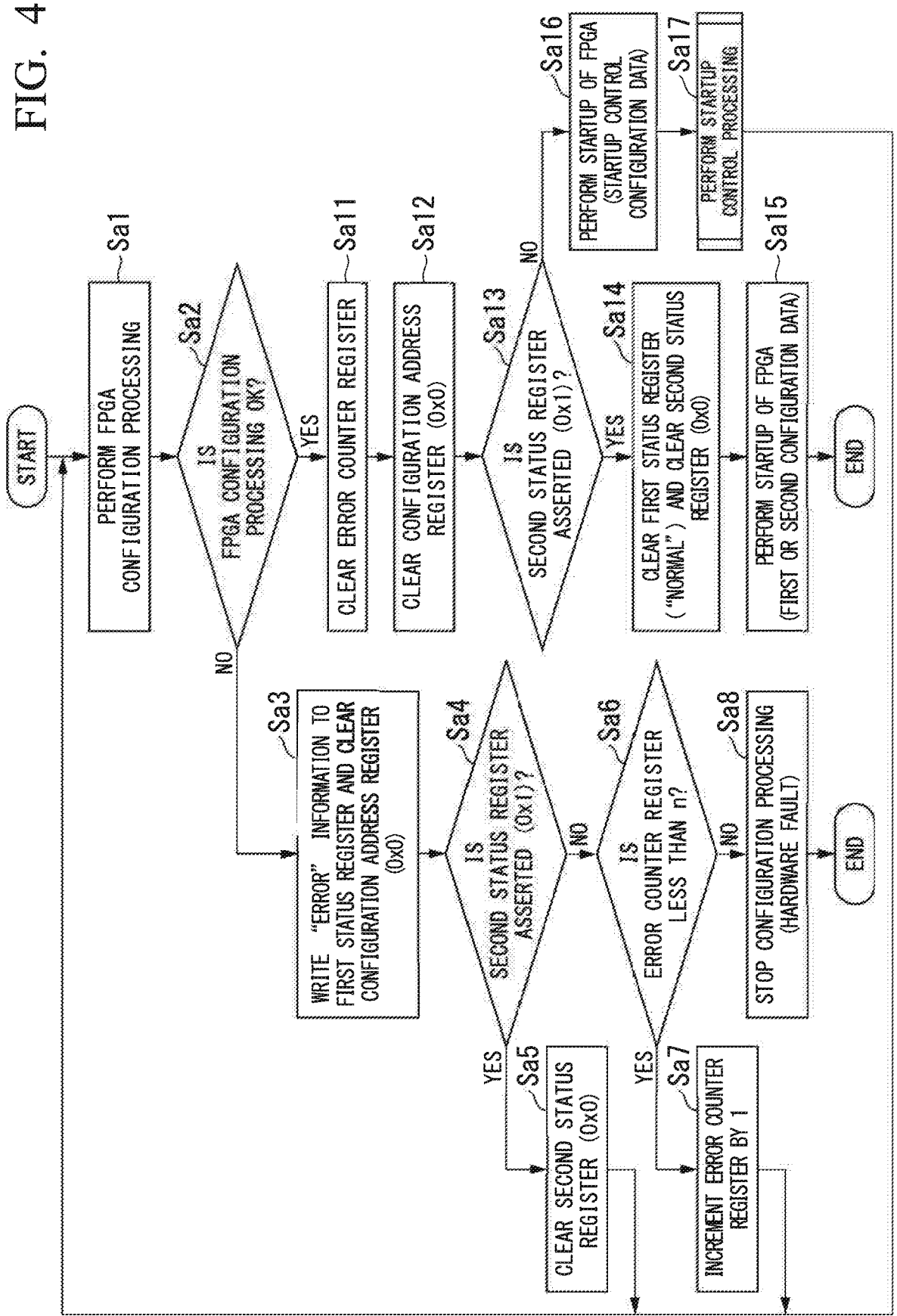
FIG. 4 is a flowchart showing configuration processing performed by a FPGA of the same embodiment.
Figure 5:
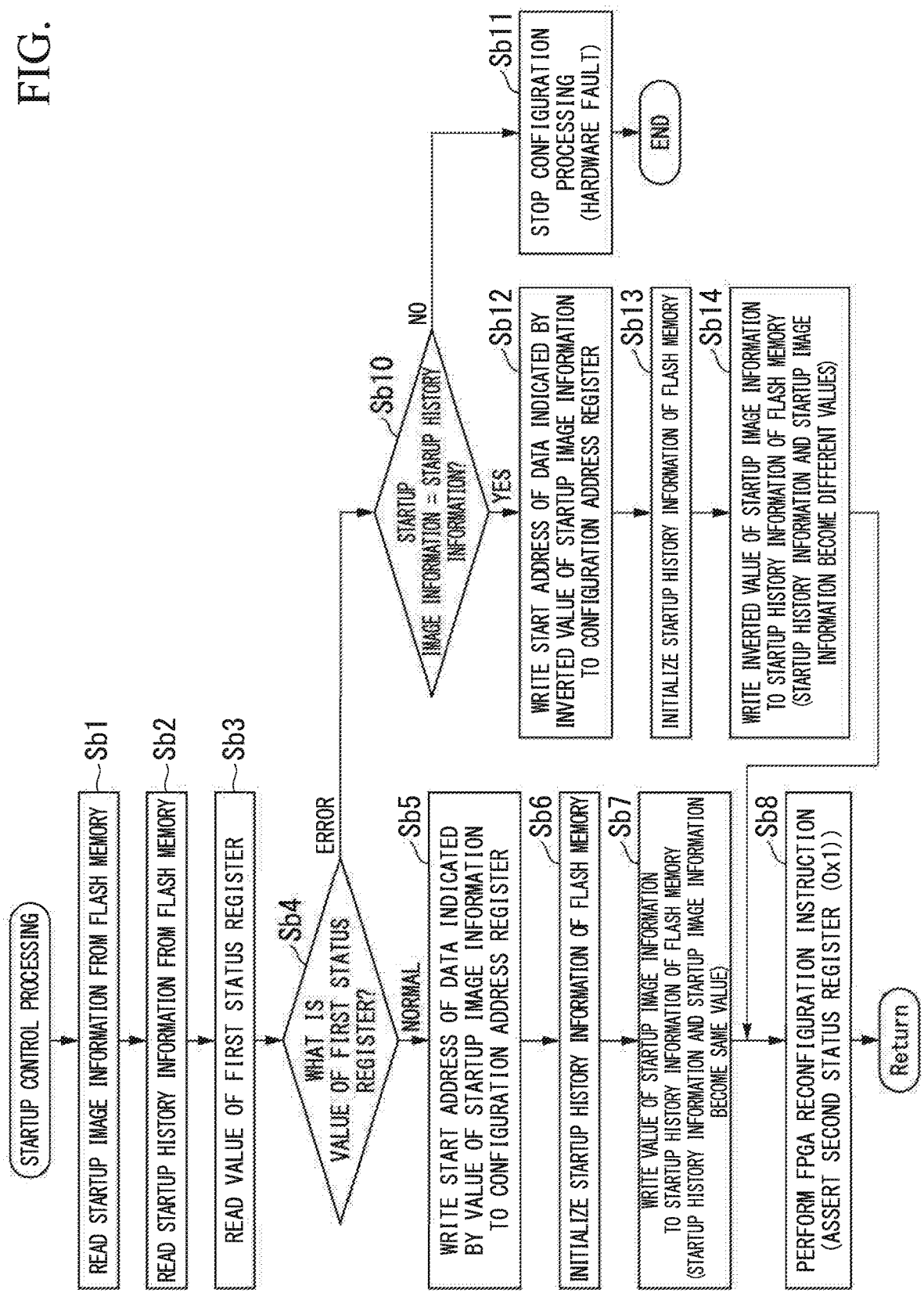
FIG. 5 is a flowchart showing startup control processing performed by a startup control logic circuit configured in the FPGA of the same embodiment.

The processing of the integrated circuit system 1 will be described with reference to FIG. 4 and FIG. 5. FIG. 4 is a flowchart showing configuration processing performed by the control unit 25. If the programmable element 27 of the FPGA 20 becomes the startup control logic circuit 35 after the configuration processing of FIG. 4, the startup control processing shown in FIG. 5 is performed by the startup control logic circuit 35.

FIG. 4 is a flowchart showing configuration processing in the FPGA 20. Upon initial startup of the FPGA 20, power-on reset processing is performed to initialize the FPGA 20. At this time, the registers, that is to say, the first status register 21, the second status register 22, the configuration address register 23, and the error counter register 24, are also initialized.

The control unit 25 reads circuit information from the flash memory 10 on the basis of the address value stored in the configuration address register 23. The control unit 25 writes the read circuit information to the configuration memory 26, and starts configuration processing (FPGA configuration processing) (step Sa1). The control unit 25 determines whether or not configuration processing was performed normally (step Sa2).

For example, if the control unit 25 detects the occurrence of a soft error during configuration processing, it determines that configuration processing was not performed normally. If the control unit 25 determines that configuration processing was not performed normally (step Sa2, No), it writes the value "0x1" indicating "ERROR" to the first status register 21 and clears the configuration address register 23 (step Sa3).

The control unit 25 determines whether or not the second status register 22 is asserted, that is to say, whether or not the value "0x1" has been stored in the second status register 22 (step Sa4). If the control unit 25 determines that the second status register 22 is asserted (step Sa4, Yes), it clears the second status register 22, that is to say, writes "0x0" to the second status register. The control unit 25 returns to step Sa1 (step Sa5).

On the other hand, if the control unit 25 determines that the second status register 22 is not asserted (step Sa4, No), it refers to the value of n stored in advance in an internal storage area. The control unit 25 determines whether or not the value indicating the number of times configuration processing has failed stored in the error counter register 24 is less than n (step Sa6). If the control unit 25 determines that the value stored in the error counter register 24 is less than n (step Sa6, Yes), it increments the value stored in the error counter register 24 by 1, and writes the value to the error counter register 24. The control unit 25 returns to step Sa1 (step Sa7).

On the other hand, if the control unit 25 determines that the value stored in the error counter register 24 is not less than n (step Sa6, No), it determines that a hardware failure has occurred, stops configuration processing, and then terminates (step Sa8).

Returning to step Sa2, if the control unit 25 determines that the configuration processing was performed normally (step Sa2, Yes), it clears the error counter register 24 (step Sa11). That is to say, the control unit 25 writes and stores the value "0" in the error counter register 24. The control unit 25 clears the configuration address register 23 (step Sa12). That is to say, the control unit 25 writes and stores the value "0x0000000" in the configuration address register 23. The control unit 25 determines whether or not the second status register 22 is asserted, that is to say, whether or not "0x1" has been stored in the second status register 22 (step Sa13).

If the control unit 25 determines that the second status register 22 is asserted (step Sa13, Yes), it clears the first status register 21 and the second status register 22 (step Sa14). That is to say, the control unit 25 writes and stores the value "0x0" indicating "NORMAL" in the first status register 21. Furthermore, the control unit 25 writes the value "0x0" to the second status register 22. The control unit 25 activates the first configuration data 11 or the second configuration data 12 for which configuration processing was performed normally to configure the programmable element 27 as the first logic circuit 31 or the second logic circuit 32, and terminates the processing (step Sa15). Whether the programmable element 27 is configured as the first logic circuit 31 or configured as the second logic circuit 32 is selected by processing that activates startup control configuration data (FPGA activation) in step Sa16.

On the other hand, if the control unit 25 determines that the second status register 22 is not asserted (step Sa13, No), it activates the startup control configuration data 15 for which configuration processing was performed normally (step Sa16). As a result of activating the startup control configuration data 15, the startup control processing (FIG. 5) by the configured startup control logic circuit 35 is started (step Sa17).

(Startup Control Processing)

Next, startup control processing performed by the startup control logic circuit 35 configured by activating the startup control configuration data 15 will be described with reference to FIG. 5. FIG. 5 is a flowchart showing startup control processing performed by the startup control logic circuit 35 configured in the FPGA 20.

The startup control logic circuit 35 reads the value stored in the startup image information 13 from the flash memory 10 (step Sb1). The startup control logic circuit 35 reads the value stored in the startup history information 14 from the flash memory 10 (step Sb2). The startup control logic circuit 35 reads the value stored in the first status register 21 (step Sb3). The startup control logic circuit 35 determines whether the value stored in the first status register 21 is "NORMAL" or "ERROR" (step Sb4).

If the startup control logic circuit 35 determines that the value stored in the first status register 21 is "NORMAL" (step Sb4, NORMAL), it writes the start address of the circuit information indicated by the value read from the startup image information 13 to the configuration address register 23 (step Sb5). That is to say, the startup control logic circuit 35 writes the start address of the first configuration data 11 or the second configuration data 12 to the configuration address register 23.

The startup control logic circuit 35 initializes the startup history information 14 of the flash memory 10 (step Sb6), and writes the value stored in the startup image information 13 to the startup history information 14 (step Sb7). As a result, the value stored in the startup history information 14 and the value stored in the startup image information 13 become the same value. The startup control logic circuit 35 asserts the second status register 22. That is to say, the startup control logic circuit 35 writes the value "0x1" to the second status register 22. Furthermore, the startup control logic circuit 35 performs processing of a FPGA reconfiguration instruction, that is to say, reinitialization of the FPGA 20 (step Sb8). Consequently, the control unit 25 starts processing from step Sa1 in the flowchart of FIG. 4.

On the other hand, if the startup control logic circuit 35 determines that the value stored in the first status register 21 is "ERROR" (step Sb4, ERROR), it determines whether or not the value read from the startup image information 13 and the value read from the startup history information 14 are the same (step Sb10). If the startup control logic circuit 35 determines that the value read from the startup image information 13 and the value read from the startup history information 14 are not the same (step Sb10, No), it terminates startup control processing in a hardware failure state (step Sb11). That is to say, the startup control logic circuit 35 stops configuration processing.

On the other hand, if the startup control logic circuit 35 determines that the value read from the startup image information 13 and the value read from the startup history information 14 are the same (step Sb10, Yes), it reads the value stored in the startup image information 13 of the flash memory 10. The startup control logic circuit 35 writes the start address of the circuit information indicated by the inverted value of the value read from the startup image information 13 to the configuration address register 23 (step Sb12). For example, if the value "0x0" has been written to the startup image information 13, the startup control logic circuit 35 writes the start address of the second configuration data 12 indicated by the inverted value "0x1" to the configuration address register 23. In contrast, for example, if the value "0x1" has been written to the startup image information 13, the startup control logic circuit 35 writes the start address of the first configuration data 11 indicated by the inverted value "0x0" to the configuration address register 23.

The startup control logic circuit 35 initializes the startup history information 14 of the flash memory 10 (step Sb13), and writes the inverted value of the value stored in the startup image information 13 to the startup history information 14 (step Sb14). As a result, the value stored in the startup history information 14 and the value stored in the startup image information 13 become different values. The startup control logic circuit 35 advances the processing to step Sb8, and asserts the second status register 22. That is to say, the startup control logic circuit 35 writes "0x1" to the second status register 22. Furthermore, the startup control logic circuit 35 performs processing of a FPGA reconfiguration instruction, that is to say, reinitialization of the FPGA 20. Consequently, the control unit 25 starts processing from step Sa1 in the flowchart of FIG. 4.

Specific Processing Example

Figure 6:
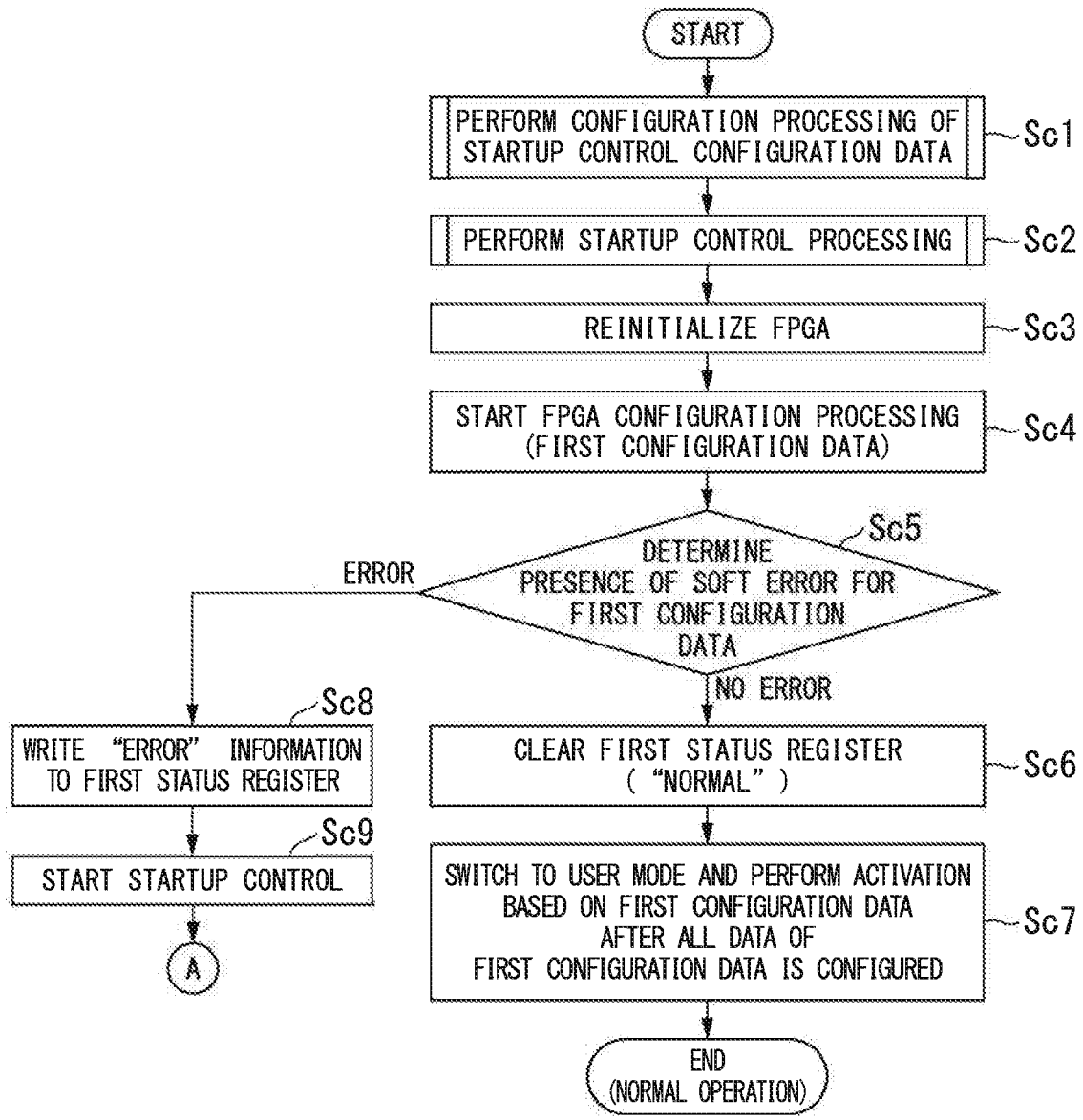
FIG. 6 is a flowchart (1) showing an overall flow of processing for activating first configuration data and second configuration data in the same embodiment.
Figure 7:
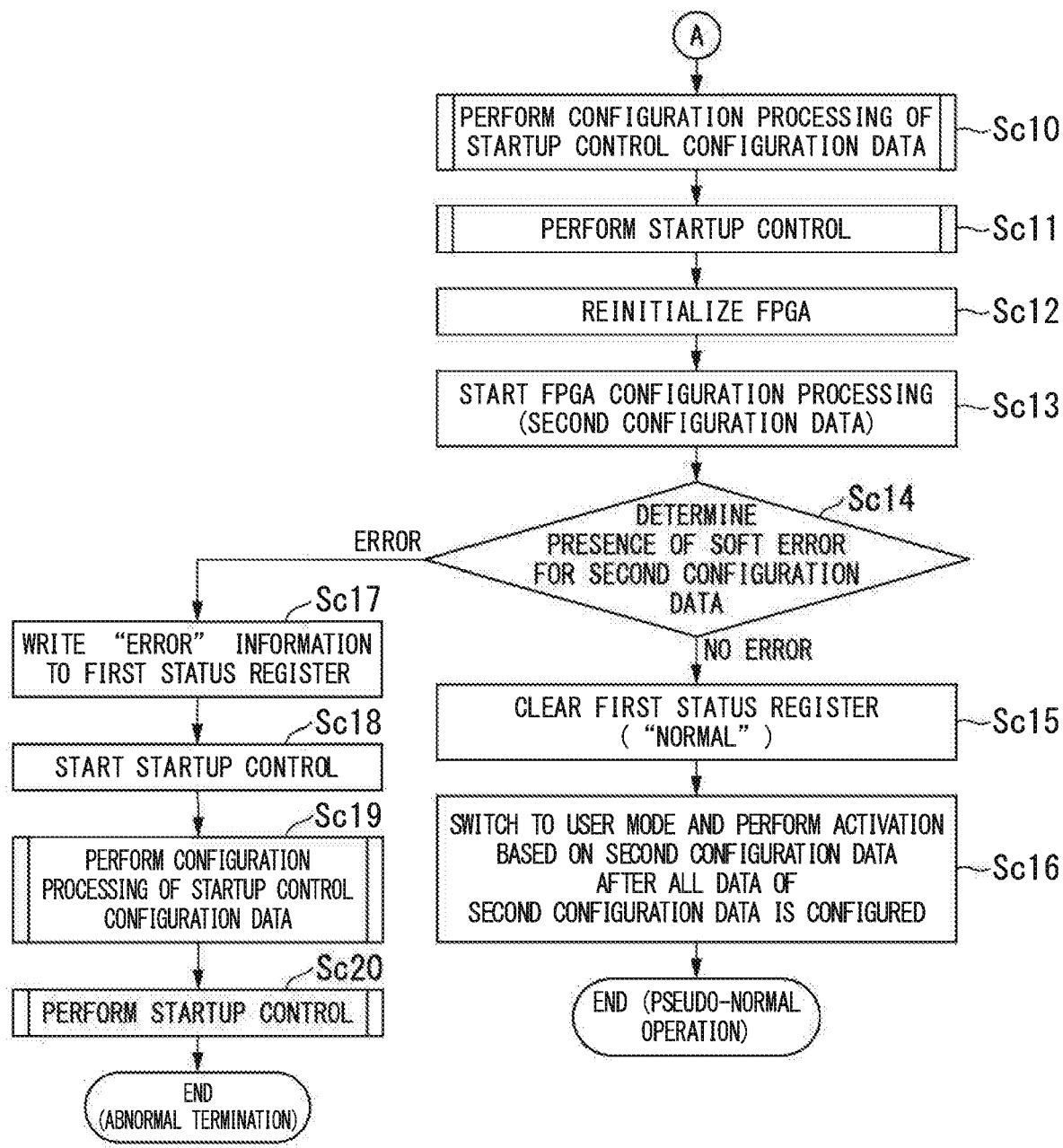
FIG. 7 is a flowchart (2) showing the overall flow of processing for activating first configuration data and second configuration data in the same embodiment.
Figure 8:
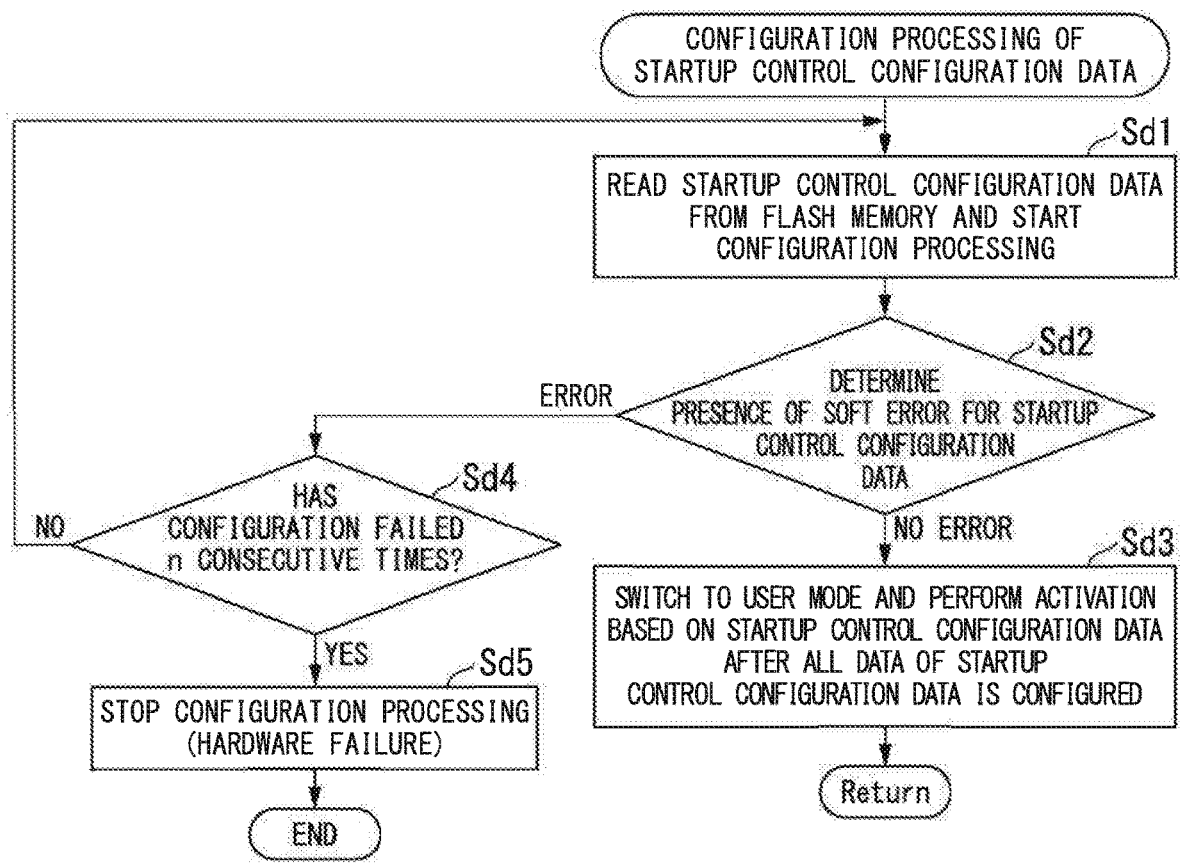
FIG. 8 is a flowchart showing configuration processing of startup control configuration data in the same embodiment.
Figure 10:
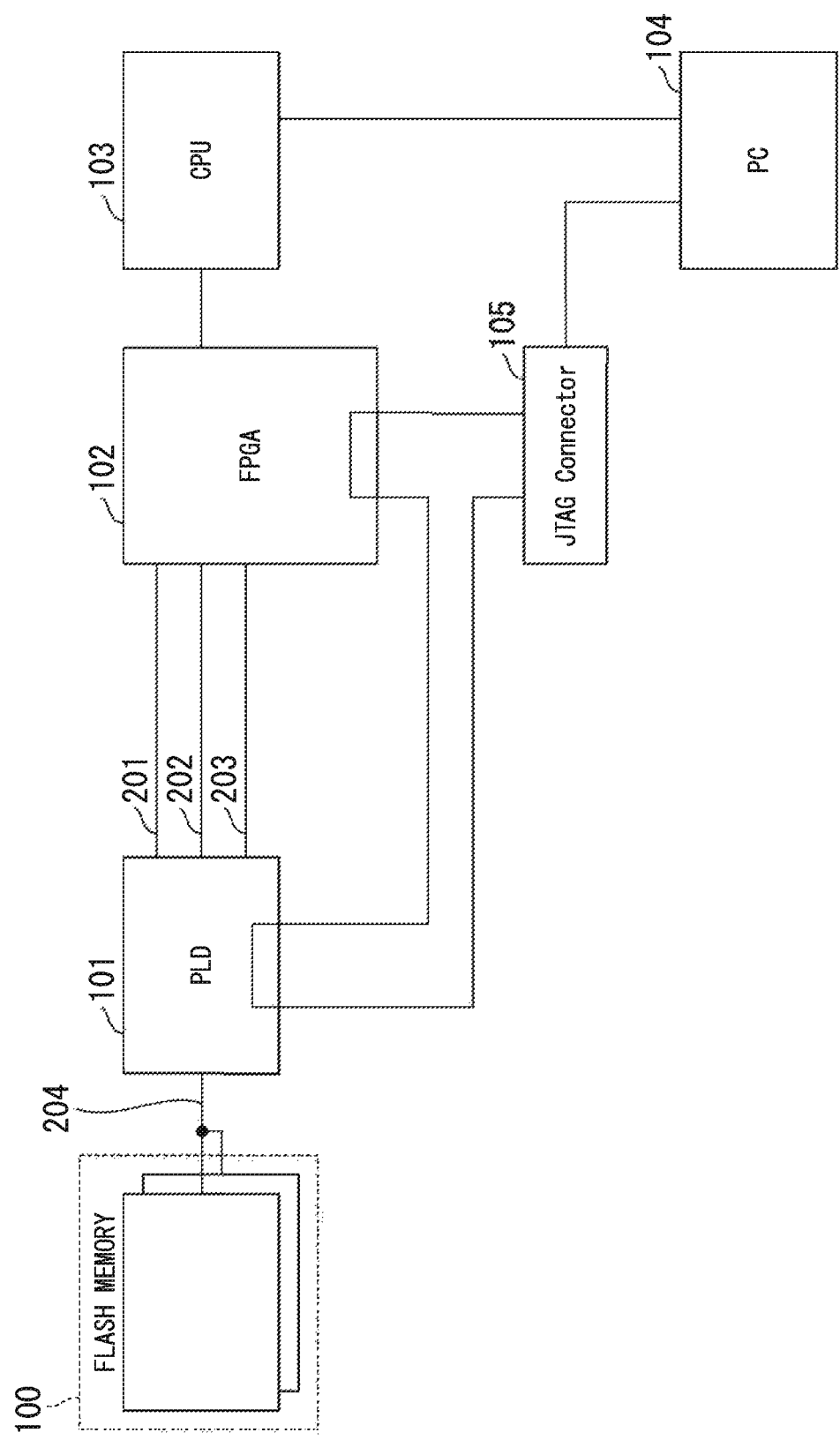
FIG. 10 is a block diagram showing a configuration of a system that switches the configuration data of the FPGA using a PLD.
Figure 11:
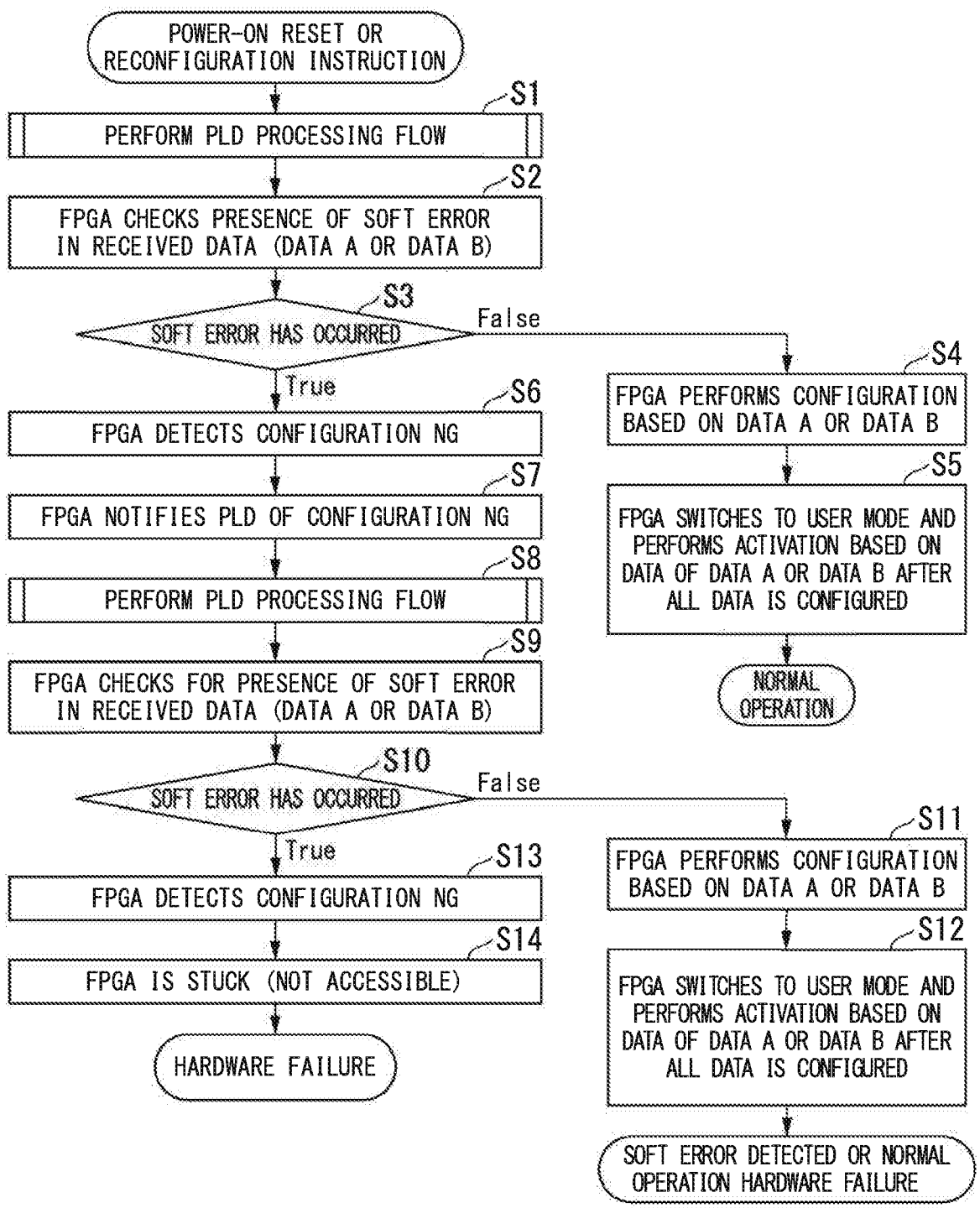
FIG. 11 is a flowchart (1) showing a flow of processing by a system that switches the configuration data of the FPGA using a PLD.
Figure 12:
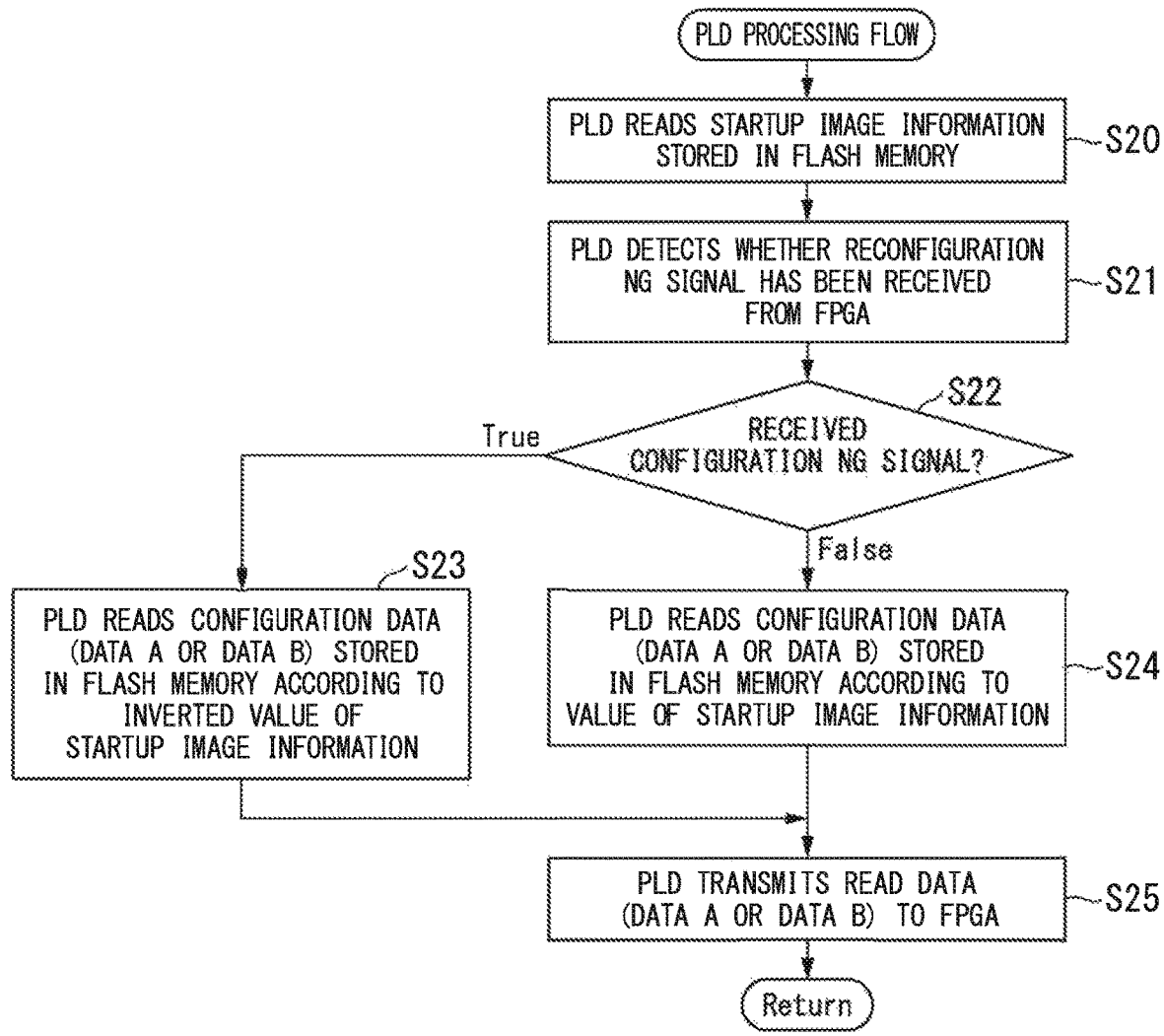
FIG. 12 is a flowchart (2) showing a flow of processing by a system that switches the configuration data of the FPGA using a PLD.

The sequence through which the first configuration data 11 and the second configuration data 12 are activated by the configuration processing shown in FIG. 4 and FIG. 5 and by the startup control processing performed by the startup control logic circuit 35 will be described with reference to FIG. 6 to FIG. 8. FIG. 6 and FIG. 7 are flowcharts showing an overall flow of processing for activating first configuration data and second configuration data. FIG. 8 is a flowchart showing configuration processing of startup control configuration data.

It is assumed that the value "0x0" indicating the first configuration data 11 is written in advance by the CPU 3 to the startup image information 13 of the flash memory 10.

Upon startup of the FPGA 20, as indicated by step Sc1 of FIG. 6, the configuration processing of startup control configuration data shown in FIG. 8 is performed. The configuration processing of startup control configuration data shown in FIG. 8 will be described with reference to the processing of the flowchart of FIG. 4.

Upon startup of the FPGA 20, the FPGA 20 is initialized. At this time, the registers, that is to say, the first status register 21, the second status register 22, the configuration address register 23, and the error counter register 24, are also initialized. As a result of being initialized, the first status register 21 stores the value "0x0" indicating "NORMAL", and the second status register 22 stores the value "0x0". As a result of being initialized, the configuration address register 23 stores the value "0x0000000", and the error counter register 24 stores the value "0".

The control unit 25 refers to the configuration address register 23 and reads circuit information from the flash memory 10 area having the start address value "0x0000000". As shown in FIG. 3, this area stores the startup control configuration data 15. The control unit 25 reads the startup control configuration data 15 from the flash memory 10, and then writes the data to the configuration memory 26. The control unit 25 starts configuration processing of the startup control configuration data 15 (FIG. 4: step Sa1; FIG. 6: step Sc1; FIG. 8: step Sd1).

In the configuration processing of the startup control configuration data 15, the control unit 25 determines, for example, whether or not a soft error has occurred. As a result, the control unit 25 determines whether or not configuration processing was performed normally (FIG. 4: step Sa2; FIG. 8: step Sd2).

If the control unit 25 determines that configuration processing of the startup control configuration data 15 was performed normally (FIG. 4: step Sa2, Yes; FIG. 8: step Sd2, no error), it clears the error counter register 24 (FIG. 4: step Sa11) and clears the configuration address register 23 (FIG. 4: step Sa12). The control unit 25 determines whether or not the second status register 22 is asserted (FIG. 4: step Sa13). Here, the second status register 22 is not asserted because it remains in an initialized state. Consequently, the control unit 25 determines that the second status register 22 is not asserted (FIG. 4: step Sa13, No). The control unit 25 activates the startup control configuration data 15 (FIG. 4: step Sa16; FIG. 8: step Sd3).

On the other hand, if the control unit 25 determines that configuration processing of the startup control configuration data 15 was not performed normally (FIG. 4: step Sa2, No; FIG. 8: step Sd2, error), it writes the value "0x1" indicating "ERROR" to the first status register 21. Furthermore, the control unit 25 clears the configuration address register 23. Here, the configuration address register 23 stores the value "0x0000000". Consequently, even if cleared, the same value "0x0000000" is stored (FIG. 4: step Sa3).

The control unit 25 determines whether or not the second status register 22 is asserted (FIG. 4: step Sa4). Here, the second status register 22 is not asserted because it remains in an initialized state. Consequently, the control unit 25 determines that the second status register 22 is not asserted (FIG. 4: step Sa4, No). The control unit 25 determines whether or not the value stored in the error counter register 24 is less than a predetermined value n (FIG. 4: step Sa6). That is to say, the determination in step Sa6 determines whether or not configuration processing of the startup control configuration data 15 has failed n consecutive times (FIG. 8: step Sd4).

If the control unit 25 determines that the value stored in the error counter register 24 is less than the predetermined value n (FIG. 4: step Sa6, Yes; FIG. 8: step Sd4, No), it performs the following processing. That is to say, the control unit 25 increments the value stored in the error counter register 24 by 1, and writes and stores the incremented value in the error counter register 24 (FIG. 4: step Sa7). Then, the control unit 25 returns the processing to step Sa1 of FIG. 4 and step Sd1 in FIG. 8. Further, the control unit 25 performs configuration processing of the startup control configuration data 15 again.

On the other hand, if the control unit 25 determines that value stored in the error counter register 24 is not less than the predetermined value n, that is to say, if configuration processing of the startup control configuration data 15 has failed n consecutive times (FIG. 4: step Sa6, No; FIG. 8: step Sd4, Yes), the control unit 25 determines that a hardware failure has occurred. The control unit 25 stops configuration processing (FIG. 4: step Sa8; FIG. 8: step Sd5).

The startup control logic circuit 35 is configured when the control unit 25 activates the startup control configuration data 15 in step Sa16 of FIG. 4 and step Sd3 of FIG. 8. Then, the startup control processing shown in FIG. 5 is started by the startup control logic circuit 35 (FIG. 4: step Sa17; FIG. 6: step Sc2). The startup control processing will be described with reference to the flowchart of FIG. 5.

The startup control logic circuit 35 refers to the address value "0x0EF0000" of the flash memory 10, and reads the value stored in the startup image information 13 (FIG. 5: step Sb1). The startup control logic circuit 35 refers to the address value "0x0EE0000" of the flash memory 10, and reads the value stored in the startup history information 14 (FIG. 5: step Sb2). The startup control logic circuit 35 reads the value stored in the first status register 21 (FIG. 5: step Sb3). The startup control logic circuit 35 determines whether the value stored in the first status register 21 is "NORMAL" or "ERROR" (FIG. 5: step Sb4). Here, "NORMAL" is stored in the first status register 21. Consequently, the startup control logic circuit 35 determines that the value stored in the first status register 21 is "NORMAL" (FIG. 5: step Sb4, NORMAL).

In step Sb1, the startup control logic circuit 35 has read the value "0x0" from the startup image information 13, where the value "0x0" indicates the first configuration data 11. That is to say, the startup control logic circuit 35 writes the start address "0x0F00000" of the first configuration data 11 to the configuration address register 23 (FIG. 5: step Sb5).

The startup control logic circuit 35 initializes the startup history information 14 of the flash memory 10 (FIG. 5: step Sb6), and writes the value stored in the startup image information 13, that is to say, the value "0x0", to the startup history information 14 (FIG. 5: step Sb7). As a result, the value stored in the startup history information 14 and the value stored in the startup image information 13 become the value "0x0" indicating the first configuration data 11. The startup control logic circuit 35 asserts the second status register 22. That is to say, the startup control logic circuit 35 writes the value "0x1" to the second status register 22. The startup control logic circuit 35 performs processing of a FPGA reconfiguration instruction, that is to say, reinitialization of the FPGA 20 (step Sb8).

Returning to FIG. 6, the FPGA 20 is reinitialized (FPGA reinitialization) according to the FPGA reconfiguration instruction (FIG. 6: step Sc3). Here, the FPGA reconfiguration instruction is not an instruction command output by the external CPU 3, or a software control unit, a firmware control unit, or the like installed to the CPU 3. As described above, the FPGA reconfiguration instruction is an instruction command output by the startup control logic circuit 35 configured as a result of activating the startup control configuration data 15. At this time, the values stored by the registers, that is to say, the first status register 21, the second status register 22, the configuration address register 23, and the error counter register 24, are retained.

The configuration processing of the first configuration data 11 is started by the control unit 25. The control unit 25 refers to the configuration address register 23 and reads circuit information from the area of the flash memory 10 having the start address value "0x0F00000". As shown in FIG. 3, this area stores the first configuration data 11. The control unit 25 reads the first configuration data 11 from the flash memory 10, and writes the data to the configuration memory 26. The control unit 25 starts configuration processing of the first configuration data 11 (FIG. 4: step Sa1, FIG. 6: step Sc4).

In the configuration processing of the first configuration data 11, the control unit 25 determines, for example, whether or not a soft error has occurred. As a result, the control unit 25 determines whether or not configuration processing was performed normally (FIG. 4: step Sa2; FIG. 6: step Sc5).

If the control unit 25 determines that configuration processing of the first configuration data 11 was performed normally (FIG. 4: step Sa2, Yes; FIG. 6: step Sc5, no error), it clears the error counter register 24 (FIG. 4: step Sa11) and clears the configuration address register 23 (FIG. 4: step Sa12). The control unit 25 determines whether or not the second status register 22 is asserted (FIG. 4: step Sa13). Here, because the processing of step Sb8 in the startup control processing of step Sc2 has been performed, the second status register 22 is asserted. Therefore, the control unit 25 determines that the second status register 22 is asserted (FIG. 4: step Sa13, Yes).

The control unit 25 writes the value "0x0" indicating "NORMAL" to clear the first status register 21, and writes the value "0x0" to clear the second status register 22 (FIG. 4: step Sa14; FIG. 6: step Sc6). After configuration processing has been performed for all of the data in the first configuration data 11, the control unit 25 switches to a user mode and activates the first configuration data 11 to configure the first logic circuit 31 (FIG. 4: step Sa16; FIG. 6: step Sc7). Then, the control unit 25 terminates processing. In this case, the first logic circuit 31 started by the first configuration data 11 specified by the startup image information 13 and originally planned by the user is operated. This corresponds to a normal operation state.

On the other hand, for example, a case will be described where it is determined that configuration processing of the first configuration data 11 was not performed normally because a soft error has occurred (FIG. 4: step Sa2, No; FIG. 6: step Sc5, error). In this case, the control unit 25 writes the value "0x1" indicating "ERROR" to the first status register 21. Furthermore, the control unit 25 writes the value "0x0000000" to clear the configuration address register 23 (FIG. 4: step Sa3; FIG. 6: step Sc8).

The control unit 25 determines whether or not the second status register 22 is asserted, that is to say, whether or not the value "0x1" is stored in the second status register 22 (FIG. 4: step Sa4). Here, because the processing of step Sb8 in the startup control processing of step Sc2 has been performed, the second status register 22 is asserted. Therefore, the control unit 25 determines that the second status register 22 is asserted (FIG. 4: step Sa4, Yes), and clears the second status register 22. That is to say, the control unit 25 writes the value "0x0" to the second status register, and returns to step Sa1 (FIG. 4: step Say; FIG. 6: step Sc9).

Proceeding to step Sc10 of FIG. 7, configuration processing of the startup control configuration data shown in FIG. 8 is performed again in the same manner as step Sc1. When the startup control configuration data 15 is activated and the startup control logic circuit 35 is configured, the startup control processing shown in FIG. 5 is started by the startup control logic circuit 35 (FIG. 7: step Sc11). The startup control processing will be described with reference to the flowchart of FIG. 5.

At the stage step Sc11 is started, the value "0x1" indicating "ERROR" is stored in the first status register 21. Furthermore, the value "0x0" indicating the first configuration data 11 is stored in the startup image information 13 of the flash memory 10. Moreover, the value "0x0" indicating the first configuration data 11 is stored in the startup history information.

The startup control logic circuit 35 refers to the address value "0x0EF0000" of the flash memory 10, and reads the value stored in the startup image information 13 (FIG. 5: step Sb1). Here, the value "0x0" indicating the first configuration data 11 is read as the startup image information 13. The startup control logic circuit 35 refers to the address value "0x0EE0000" of the flash memory 10, and reads the value stored in the startup history information 14 (FIG. 5: step Sb2). Here, the startup control logic circuit 35 reads the value "0x0" indicating the first configuration data 11 as the startup history information 14.

The startup control logic circuit 35 reads the value stored in the first status register 21 (FIG. 5: step Sb3). The startup control logic circuit 35 determines whether the value stored in the first status register 21 is "NORMAL" or "ERROR" (FIG. 5: step Sb4). Here, "ERROR" is stored. Consequently, the startup control logic circuit 35 determines that the value stored in the first status register 21 is "ERROR" (FIG. 5: step Sb4, ERROR).

The startup control logic circuit 35 determines whether or not the value read from the startup image information 13 and the value read from the startup history information 14 are the same (FIG. 5: step Sb10). Here, the value of the startup image information 13 and the value of the startup history information 14 are both "0x0". Consequently, the startup control logic circuit 35 determines that the value read from the startup image information 13 and the value read from the startup history information 14 are the same (FIG. 5: step Sb10, Yes).

The startup control logic circuit 35 writes the circuit information indicated by the inverted value "0x1" of the value read from the startup image information 13, that is to say, the start address value "0x2780000" of the second configuration data 12, to the configuration address register 23 (FIG. 5: step Sb12). The startup control logic circuit 35 initializes the startup history information 14 of the flash memory 10 (FIG. 5: step Sb13), and writes the inverted value "0x1" of the value stored in the startup image information 13 to the startup history information 14 (FIG. 5: step Sb14). As a result, the value stored in the startup history information 14 becomes "0x1", and the value stored in the startup image information 13 becomes "0x0".

The startup control logic circuit 35 advances the processing to step Sb8. The startup control logic circuit 35 asserts the second status register 22. That is to say, the startup control logic circuit 35 writes the value "0x1" to the second status register 22. The startup control logic circuit 35 performs processing of an FPGA reconfiguration instruction, that is to say, reinitialization of the FPGA 20 (FIG. 5: step Sb8).

After the startup control processing (step Sc11) shown in FIG. 5, the process returns to FIG. 7 and the FPGA 20 is reinitialized according to the FPGA reconfiguration instruction (FIG. 7: step Sc12). At this time, the values stored by the registers, that is to say, the first status register 21, the second status register 22, the configuration address register 23, and the error counter register 24, are retained. That is to say, the first status register 21 stores the value "0x1" indicating "ERROR". The second status register 22 stores the asserted value "0x1". The configuration address register 23 stores the value "0x2780000", which is the start address of the second configuration data 12. The error counter register 24 stores the value "0".

The configuration processing of the second configuration data 12 is started by the control unit 25. The control unit 25 refers to the configuration address register 23 and reads circuit information from the area of the flash memory 10 having the start address value "0x2780000". As shown in FIG. 3, this area stores the second configuration data 12. The control unit 25 reads the second configuration data 12 from the flash memory 10, and writes the data to the configuration memory 26. The control unit 25 starts configuration processing of the second configuration data 12 (FIG. 4: step Sa1; FIG. 7: step Sc13).

In the configuration processing of the second configuration data 12, the control unit 25 determines, for example, whether or not a soft error has occurred. As a result, the control unit 25 determines whether or not configuration processing was performed normally (FIG. 4: step Sa2; FIG. 7: step Sc14).

If the control unit 25 determines that configuration processing of the second configuration data 12 was performed normally (FIG. 4: step Sa2, Yes; FIG. 7: step Sc14, no error), it clears the error counter register 24 (FIG. 4: step Sa11) and clears the configuration address register 23 (FIG. 4: step Sa12). The control unit 25 determines whether or not the second status register 22 is asserted (FIG. 4: step Sa13). Here, because the processing of step Sb8 in the startup control processing of step Sc11 has been performed, the second status register 22 is asserted. Therefore, the control unit 25 determines that the second status register 22 is asserted (FIG. 4: step Sa13, Yes).

The control unit 25 writes the value "0x0" indicating "NORMAL" to clear the first status register 21, and writes the value "0x0" to clear the second status register 22 (FIG. 4: step Sa14; FIG. 7: step Sc15). After configuration processing has been performed for all of the data in the second configuration data 12, the control unit 25 switches to a user mode and activates the second configuration data 12 to configure the second logic circuit 32 (FIG. 4: step Sa16; FIG. 7: step Sc16). Then, the control unit 25 terminates processing. In this case, activation of the first configuration data 11 specified by the startup image information 13 and originally planned by the user has failed, that is to say, configuration of the first logic circuit 31 has failed. Further, the second logic circuit 32 configured by the second configuration data 12 is operated. This corresponds to a pseudo-normal operation state.

On the other hand, for example, processing performed in a case where the control unit 25 determines that configuration processing of the second configuration data 12 was not performed normally because a soft error has occurred (FIG. 4: step Sa2, No; FIG. 7: step Sc14, error) will be described. In this case, the control unit 25 writes the value "0x1" indicating "ERROR" to the first status register 21. Furthermore, the control unit 25 writes the value "0x0000000" to clear the configuration address register 23 (FIG. 4: step Sa3; FIG. 6: step Sc17).

The control unit 25 determines whether or not the second status register 22 is asserted, that is to say, whether or not the value "0x1" is stored in the second status register 22 (FIG. 4: step Sa4). Here, because the processing of step Sb8 in the startup control processing of step Sc2 has been performed, the second status register 22 is asserted. Therefore, the control unit 25 determines that the second status register 22 is asserted (FIG. 4: step Sa4, Yes), and clears the second status register 22. That is to say, the control unit 25 writes the value "0x0" to the second status register, and returns to step Sa1 (FIG. 4: step Say; FIG. 7: step Sc18).

The configuration processing of startup control configuration data shown in FIG. 8 is performed again in the same manner as step Sc1 and step Sc10 (FIG. 7: step Sc19). When the startup control configuration data 15 is activated and the startup control logic circuit 35 is configured, the startup control processing shown in FIG. 5 is started by the startup control logic circuit 35 (FIG. 7: step Sc20). The startup control processing (step Sc20) will be described with reference to the flowchart of FIG. 5.

At the stage step Sc20 is started, the value "0x1" indicating "ERROR" is stored in the first status register 21. Furthermore, the value "0x0" indicating the first configuration data 11 is stored in the startup image information 13 of the flash memory 10. Moreover, the value "0x1" indicating the second configuration data 12 is stored in the startup history information.

The startup control logic circuit 35 refers to the address value "0x0EF0000" of the flash memory 10, and reads the value stored in the startup image information 13 (FIG. 5: step Sb1). Here, the value "0x0" indicating the first configuration data 11 is read as the startup image information 13. The startup control logic circuit 35 refers to the address value "0x0EE0000" of the flash memory 10, and reads the value stored in the startup history information 14 (FIG. 5: step Sb2). Here, the startup control logic circuit 35 reads the value "0x1" indicating the second configuration data 12 as the startup history information 14.

The startup control logic circuit 35 reads the value stored in the first status register 21 (FIG. 5: step Sb3). The startup control logic circuit 35 determines whether the value stored in the first status register 21 is "NORMAL" or "ERROR" (FIG. 5: step Sb4). Here, "ERROR" is stored. Consequently, the startup control logic circuit 35 determines that the value stored in the first status register 21 is "ERROR" (FIG. 5: step Sb4, ERROR).

The startup control logic circuit 35 determines whether or not the value read from the startup image information 13 and the value read from the startup history information 14 are the same (FIG. 5: step Sb10). Here, the value of the startup image information 13 and the value of the startup history information 14 are different values. Consequently, the startup control logic circuit 35 determines that the value read from the startup image information 13 and the value read from the startup history information 14 are not the same (FIG. 5: step Sb10, No), and terminates startup control processing in a hardware failure state (step Sb11). In this case, configuration of the first logic circuit 31 by the first configuration data 11 specified in the startup image information 13 and originally planned by the user has failed. Further, configuration of the second logic circuit 32 by the second configuration data 12 activated instead has also failed. This corresponds to an abnormal termination state.

In the embodiment above, in FIG. 6 and FIG. 7, processing performed in a case where the value "0x0" indicating the first configuration data 11 is specified for the startup image information 13 was described. However, the present invention is not limited to such an embodiment. If the value "0x1" indicating the second configuration data 12 is specified for the startup image information 13, the second configuration data 12 is activated first. Then, if configuration of the second logic circuit 32 fails based on the second configuration data 12, the first configuration data is activated. Further, if configuration of the first logic circuit 31 also fails based on the first configuration data 11, an abnormal termination occurs.

The processing described in the embodiment above is summarized as indicated by the relationships presented in the table in FIG. 9. In the table in FIG. 9, patterns 1, 3, 5, and 7 correspond to the patterns described with reference to FIG. 6 to FIG. 8. Patterns 2, 4, 6, and 8 correspond to those patterns where a value indicating the second configuration data 12 is specified for the startup image information 13.

As described in the embodiment above, the flash memory 10 stores the first configuration data 11, the second configuration data 12, and the startup control configuration data 15. When configuration of the logic circuit fails based on either the first configuration data 11 or the second configuration data 12, the other configuration data that has not failed is selected as the startup control configuration data 15. The FPGA 20 reads the startup control configuration data 15 from the flash memory 10 at the time of startup, or when configuration of the logic circuit fails based on any of the pieces of circuit information. The FPGA 20 configures the startup control logic circuit 35 according to the read startup control configuration data 15. The FPGA 20 reads from the flash memory 10 either the first configuration data 11 or the second configuration data 12 that has not failed in configuring the logic circuit selected by the configured startup control logic circuit 35, and configures the logic circuit according to the read configuration data. As a result, in the FPGA 20, if configuration of the logic circuit fails based on the configuration data of either the first configuration data 11 or the second configuration data 12, it becomes possible to perform startup based on the other configuration data that has not failed, without using a separate control device such as a PLD.

Furthermore, according to the configuration of the embodiment above, other configuration data can be activated even if configuration processing fails due to various factors. Consequently, a redundant function can be provided such that a system that includes the FPGA 20 does not become stuck. As a result, in the integrated circuit system 1 according to the present embodiment, the device cost rate and the installation space requirements can be improved. Furthermore, the configuration of the present embodiment provides the effects of the technique described in Patent Document 1, while also enabling BOM (Bill of Materials) costs and installation space to be reduced. This makes it possible to contribute toward achieving targets with respect to costs associated with device development and in terms of installation space.

Furthermore, as described above, the processing shown in FIG. 4 is realized using the functions of the FPGA 20, which is provided for startup of circuit information which configures the logic circuit which is actually used, such as the first configuration data 11 and the second configuration data 12. The startup control configuration data 15 is stored in the first storage area of the flash memory 10, that is to say, in the area having the address value "0x0000000". Consequently, when the FPGA 20 is activated, the configuration address register 23 is initialized, and the configuration address register 23 stores the value "0x0000000" which is the start address of the startup control configuration data 15. As a result, at the time of startup of the FPGA 20, processing is always started from the configuration processing of the startup control configuration data 15. Furthermore, if configuration of the logic circuit fails based on any of the pieces of configuration data, the configuration address register 23 is cleared to the value "0x0000000" in step Sa3 of FIG. 4. As a result, the processing is restarted from the configuration processing of the startup control configuration data 15. Consequently, when configuration of the logic circuit fails based on either the first configuration data 11 or the second configuration data 12, as long as the processing that performs startup based on the other configuration data that has not failed is defined in the startup control configuration data 15, it becomes possible to perform startup based on the other configuration data that has not failed without using a separate control device such as a PLD.

The arrangement in the flash memory 10 shown in FIG. 3 is an example, and is not limited to the present embodiment. For example, the startup control configuration data 15 does not have to be stored with the start address value "0x0000000" in the flash memory 10. The startup control configuration data 15 may be stored in another storage area in the flash memory 10. However, in that case, for example, if startup of the FPGA 20 is performed first, then processing is performed before the processing of step Sa1 that writes the start address of the startup control configuration data 15 (the address of another storage area) to the configuration address register 23. Furthermore, in step Sa3, processing is performed that writes the start address of the startup control configuration data 15 instead of clearing the configuration address register 23.

Moreover, in the embodiment described above, the flash memory 10 may be configured by a plurality of flash memories. In this case, the first configuration data 11 and the second configuration data 12 and the like may be stored in different flash memories.

Furthermore, the embodiment described above was described in terms of processing based on two pieces of configuration data, namely the first configuration data 11 and the second configuration data 12. However, the configuration data such as the first configuration data 11 and the second configuration data 12 used for operation by the user other than the startup control configuration data 15 may be a plurality of configuration data. In this case, the startup image information 13 is configured such that the plurality of configuration data can be specified. Furthermore, the startup history information 14 retains not only a history of the configuration data that failed to activate immediately before, but also a history of the configuration data that failed to activate in the past and the like. Moreover, in the processing shown in FIG. 5, processing is performed that refers to the startup history information 14, which stores the history of the configuration data whose activation has failed in the past, and uses the configuration data whose activation has not failed by sequentially switching the data.

Furthermore, although the embodiment described above is described for the FPGA 20, it may also be applied to a volatile programmable device other than the FPGA 20.

The FPGA 20 functions as a device that includes a startup control circuit by reading from the flash memory 10 a startup control program, which corresponds to the startup control circuit information described above, and storing and activating the program in the configuration memory 26. The startup control program may be recorded in a computer-readable recording medium. The computer-readable recording medium refers to a portable medium such as a flexible disk, a magnetic optical disk, a ROM, or a CD-ROM, or a storage device such as a hard disk built into a computer system. The startup control program may be transmitted via a telecommunication line.

Figure 13:
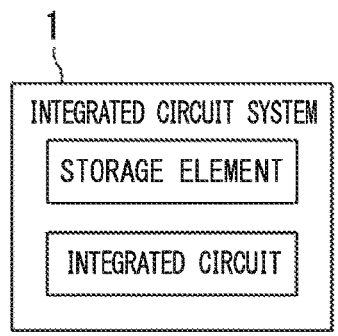
FIG. 13 is a diagram showing a minimum configuration of an integrated circuit system.

FIG. 13 is a diagram showing a minimum configuration of an integrated circuit system.

The integrated circuit system includes at least a recording element and an integrated circuit.

The recording element (flash memory 10) stores in advance a plurality of pieces of circuit information, and startup control circuit information which is used to configure a startup control logic circuit for selecting circuit information that has not failed in configuring a logic circuit.

The integrated circuit (FPGA 20) reads the startup control circuit information from the storage element and configures the startup control logic circuit at the time of startup or when configuration of the logic circuit based on any of the plurality of pieces of circuit information has failed. Further, the integrated circuit causes the configured startup control logic circuit to select the circuit information that has not failed in configuring the logic circuit. The integrated circuit reads the circuit information selected by the startup control logic circuit from the storage element, and configures the logic circuit according to the circuit information.

An embodiment of the present invention has been described above. However, specific configurations are in no way limited to the present embodiment, and include designs and the like within a scope not departing from the spirit of the present invention.

Priority is claimed on Japanese Patent Application No. 2017-055025, filed Mar. 21, 2017, the disclosure of which is incorporated herein in its entirety.

INDUSTRIAL APPLICABILITY

According to the present invention, when startup fails in a programmable integrated circuit, it becomes possible for startup to be performed using other circuit information that has not failed, and without using another control device.

REFERENCE SYMBOLS

1 Integrated circuit system
2 Connection line
3 CPU
4 PC
5 JTAG connector
10 Flash memory
20 FPGA
21 First status register
22 Second status register
23 Configuration address register
24 Error counter register
25 Control unit
26 Configuration memory
27 Programmable element
28 I/O circuit
29 JTAG circuit
31 First logic circuit
32 Second logic circuit
35 Startup control logic circuit

What is claimed is:
1. An integrated circuit system comprising:
a storage element that stores, in advance, a plurality of pieces of circuit information, including first circuit information and second circuit information, startup control circuit information used to configure a startup control logic circuit for selecting circuit information that has not failed in configuring a logic circuit, startup history information indicating circuit information that the integrated circuit has read from the storage element immediately before, and startup image information indicating which of the first circuit information and the second circuit information is to be started first; and
an integrated circuit that:
comprises a storage unit that stores information indicating whether or not the circuit information indicated by the startup history information succeeded in configuration of the logic circuit, and
based on a time of startup occurring or a configuration of the logic circuit based on any of the plurality of pieces of circuit information failing:

configures the startup control logic circuit based on reading the startup control circuit information from the storage element, controls the configured startup control logic circuit to select the circuit information that has not failed in configuring the logic circuit reads the circuit information selected by the startup control logic circuit from the storage element, and configures the logic circuit according to the circuit information, wherein the startup control logic circuit selects, on a basis of the startup image information, the startup history information and the information indicating whether or not the circuit information indicated by the startup history information succeeded in configuration of the logic circuit stored in the storage unit, the circuit information to configure the logic circuit based on the circuit information indicated by the startup image information, and if one of the pieces of circuit information indicated by the startup image information fails to configure the logic circuit, selects another piece of the pieces of circuit information to configure the logic circuit, and the integrated circuit, if the other piece of the circuit information fails to configure the logic circuit, terminates the processing.

2. The integrated circuit system according to claim 1, wherein:

the startup control circuit information is stored at the beginning of a storage area of the storage element; and the integrated circuit, at the time of startup or when the configuration of the logic circuit based on any of the plurality of pieces of circuit information has failed, reads the startup control circuit information from the storage element and configures the startup control logic circuit by reading from the information stored at the beginning of the storage element.

3. A startup control method of an integrated circuit system provided with a storage element that stores a plurality of pieces of circuit information, including first circuit information and second circuit information, an integrated circuit which reads the circuit information from the storage element and configures a logic circuit according to the circuit information, the startup control method comprising:

storing, in the storage element, startup control circuit information used to configure a startup control logic circuit for selecting the circuit information that has not failed in configuring the logic circuit, startup history information indicating the circuit information that the integrated circuit has read from the storage element immediately before, and startup image information indicating which of the first circuit information and the second circuit information is to be started first;

storing, in a storage unit of the integrated circuit, information indicating whether or not the circuit information indicated by the startup history information succeeded in configuration of the logic circuit; and based on a time of startup occurring or a configuration of the logic circuit based on any of the plurality of pieces of circuit information failing:

configuring the startup control logic circuit with respect to the integrated circuit based on the startup control circuit information in the storage element;

controlling the configured startup control logic circuit to select, on a basis of the startup image information, the startup history information and the information indicating whether or not the circuit information indicated by the startup history information succeeded in configuration of the logic circuit stored in the storage unit, the circuit information to configure the logic circuit based on the circuit information indicated by the startup image information, and if one of the pieces of circuit information indicated by the startup image information fails to configure the logic circuit, selects another piece of the pieces of circuit information to configure the logic circuit;

configuring the logic circuit with respect to the integrated circuit based on the circuit information selected by the startup control logic circuit; and terminating the processing if the other piece of the circuit information fails to configure the logic circuit.

4. A non-transitory computer-readable recording medium storing a startup control program that serves as startup control circuit information that causes an integrated circuit, which is connected to a storage element that stores a plurality of pieces of circuit information, including first circuit information and second circuit information, and configures a logic circuit according to the circuit information, to execute the steps of:

based on a time of startup occurring or a configuration of the logic circuit based on any of the plurality of pieces of circuit information failing:

configuring a startup control logic circuit to control the startup control logic circuit to select, on a basis of startup image information, startup history information and information indicating whether or not the circuit information indicated by the startup history information succeeded in configuration of the logic circuit stored in a storage unit of the integrated circuit, the circuit information to configure the logic circuit based on the circuit information indicated by the startup image information, and if one of the pieces of circuit information indicated by the startup image information fails to configure the logic circuit, select another piece of the circuit information, the storage element storing the startup control circuit information, the startup history information indicating the circuit information that the integrated circuit has read from the storage element immediately before, and the startup image information indicating which of the first circuit information and the second circuit information is to be started first, the storage unit storing the information indicating whether or not the circuit information indicated by the startup history information succeeded in configuration of the logic circuit;

reading the circuit information selected by the startup control logic circuit from the storage element;

configuring the logic circuit based on the circuit information; and terminating the processing if the other piece of the circuit information fails to configure the logic circuit.

* * * * *